United States Patent
Majhi et al.

(10) Patent No.: US 8,900,946 B2
(45) Date of Patent: Dec. 2, 2014

(54) METHOD OF FORMING LAYERS USING ATOMIC LAYER DEPOSITION

(71) Applicant: Micron Technology, Inc., Boise, ID (US)

(72) Inventors: Prashant Majhi, Austin, TX (US); Kyu S. Min, San Jose, CA (US); Wilman Tsai, Saratoga, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/171,010

(22) Filed: Feb. 3, 2014

(65) Prior Publication Data

US 2014/0148002 A1 May 29, 2014

Related U.S. Application Data

(62) Division of application No. 12/115,192, filed on May 5, 2008, now Pat. No. 8,643,079.

(51) Int. Cl.
| | |
|---|---|
| *H01L 21/336* | (2006.01) |
| *H01L 21/28* | (2006.01) |
| *H01L 21/314* | (2006.01) |
| *H01L 21/02* | (2006.01) |
| *B82Y 10/00* | (2011.01) |
| *H01L 29/423* | (2006.01) |

(52) U.S. Cl.
CPC ...... *H01L 21/28273* (2013.01); *H01L 21/3141* (2013.01); *H01L 21/0262* (2013.01); *B82Y 10/00* (2013.01); *H01L 29/42324* (2013.01); *H01L 21/0228* (2013.01)
USPC ............................ 438/257; 438/288; 257/316

(58) Field of Classification Search
USPC .................. 438/257, 288; 257/315, 316, 317, 257/E21.21
See application file for complete search history.

(56) References Cited

U.S. PATENT DOCUMENTS

| | | | |
|---|---|---|---|
| 6,090,666 A | 7/2000 | Ueda et al. | |
| 6,140,181 A | 10/2000 | Forbes et al. | |
| 6,144,062 A | 11/2000 | Mine et al. | |
| 6,656,792 B2 | 12/2003 | Choi et al. | |
| 6,674,133 B2 | 1/2004 | Chang | |
| 6,756,272 B1 | 6/2004 | Nakagawa | |
| 6,924,969 B2 | 8/2005 | Hill | |
| 7,485,526 B2 * | 2/2009 | Mouli et al. ................... | 438/257 |
| 2004/0046383 A1 | 3/2004 | Nagel et al. | |
| 2004/0130941 A1 | 7/2004 | Kan et al. | |

(Continued)

OTHER PUBLICATIONS

FlexAL™ "Systems for remote plasma and thermal ALD", Oxford Instruments Plasma Technology Ltd., 2007, (2 pgs.).

(Continued)

*Primary Examiner* — Phuc Dang
(74) *Attorney, Agent, or Firm* — Dicke, Billig & Czaja, PLLC

(57) ABSTRACT

Nanocrystal structures formed using atomic layer deposition (ALD) processes are useful in the formation of integrated circuits such as memory devices. Rather than continuing the ALD process until a continuous layer is formed, the ALD process is halted prematurely to leave a discontinuous formation of nanocrystals which are then capped by a different material, thus forming a layer with a discontinuous portion and a bulk portion. Such nanocrystals can serve as charge-storage sites within the bulk portion, and the resulting structure can serve as a floating gate of a floating-gate memory cell. A floating gate may contain one or more layers of such nanocrystal structures.

21 Claims, 8 Drawing Sheets

(56) References Cited

U.S. PATENT DOCUMENTS

| | | |
|---|---|---|
| 2005/0112820 A1 | 5/2005 | Chen et al. |
| 2005/0185466 A1 | 8/2005 | Prall |
| 2005/0269628 A1 | 12/2005 | King |
| 2006/0286747 A1 | 12/2006 | Mouli et al. |
| 2007/0018342 A1 | 1/2007 | Sandhu et al. |
| 2007/0020923 A1 | 1/2007 | Kraus et al. |
| 2007/0077750 A1* | 4/2007 | Ma et al. .................. 438/618 |
| 2007/0105312 A1 | 5/2007 | Min |
| 2008/0153222 A1 | 6/2008 | Lee et al. |
| 2009/0039405 A1 | 2/2009 | Cheng et al. |
| 2009/0045447 A1* | 2/2009 | Ramaswamy et al. ........ 257/314 |
| 2009/0134443 A1 | 5/2009 | Mouli et al. |
| 2009/0302365 A1 | 12/2009 | Bhattacharyya |

OTHER PUBLICATIONS

Atomic Layer Deposition "A Tutorial by Cambridge NanoTech Inc.", Cambridge NanoTech Inc., www.cambridgenanotech.com, (41 pgs.).

T.C. Chang et al.; Quasisuperlattice storage: A concept of multilevel charge storage; Jul. 12, 2004; Applied Physics Letters, vol. 85 No. 2; pp. 248-250.

* cited by examiner

METHOD OF FORMING LAYERS USING ATOMIC LAYER DEPOSITION

RELATED APPLICATION

This Application is a Divisional of U.S. application Ser. No. 12/115,192, filed May 5, 2008 (now U.S. Pat. No. 8,643,079), which is commonly assigned and incorporated herein by reference.

TECHNICAL FIELD

The present disclosure relates generally to integrated circuit devices, and in a particular embodiment, the present disclosure relates to methods of forming nanocrystal structures using atomic layer deposition and apparatus making use of such nanocrystal structures.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

There is a general desire to reduce the sizes of the various components in integrated circuit fabrication. Reducing size is generally accompanied by a reduction in cost, as more and more devices can be fabricated on a single substrate, and a reduction in power requirements, as less power is needed to switch smaller components. However, this size reduction does not come without a cost. As integrated circuit devices become smaller and smaller, current or charge leakage and parasitic capacitance between components become increasingly problematic. An example of the detrimental impact of leakage and parasitic capacitance can be seen in flash memory devices.

Flash memory devices are one particular class of memory devices that have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming of a charge storage node, such as a floating gate, or trapping layers or other physical phenomena, determine the data value of each cell. By defining two or more ranges of threshold voltages to correspond to individual data values, one or more bits of information may be stored on each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

For a flash memory device utilizing floating-gate memory cells, where a level of charge stored on the floating-gate affects its threshold voltage, a reduction in size means less volume for charge storage. If the same material were used for the floating gates of two differently sized memory cells, the smaller memory cell would be capable of a smaller difference in its possible threshold voltages than the larger memory cell. And any charge leakage, such as stress-induced gate leakage, would have a larger impact on the threshold voltage of the smaller memory cell. In addition, due to parasitic capacitive coupling to floating gates of adjacent memory cells, more margin is required to avoid a false reading of the data value of the memory cell. Compensating for leakage and parasitic capacitance concerns with a smaller range of threshold voltages makes it increasingly difficult to distinguish between differing data values of smaller memory cells.

For the reasons stated above, and for other reasons that will become apparent to those skilled in the art upon reading and understanding the present specification, there is a need in the art for alternative structures and their processes in the formation of integrated circuit devices.

DETAILED DESCRIPTION

Figure 1:
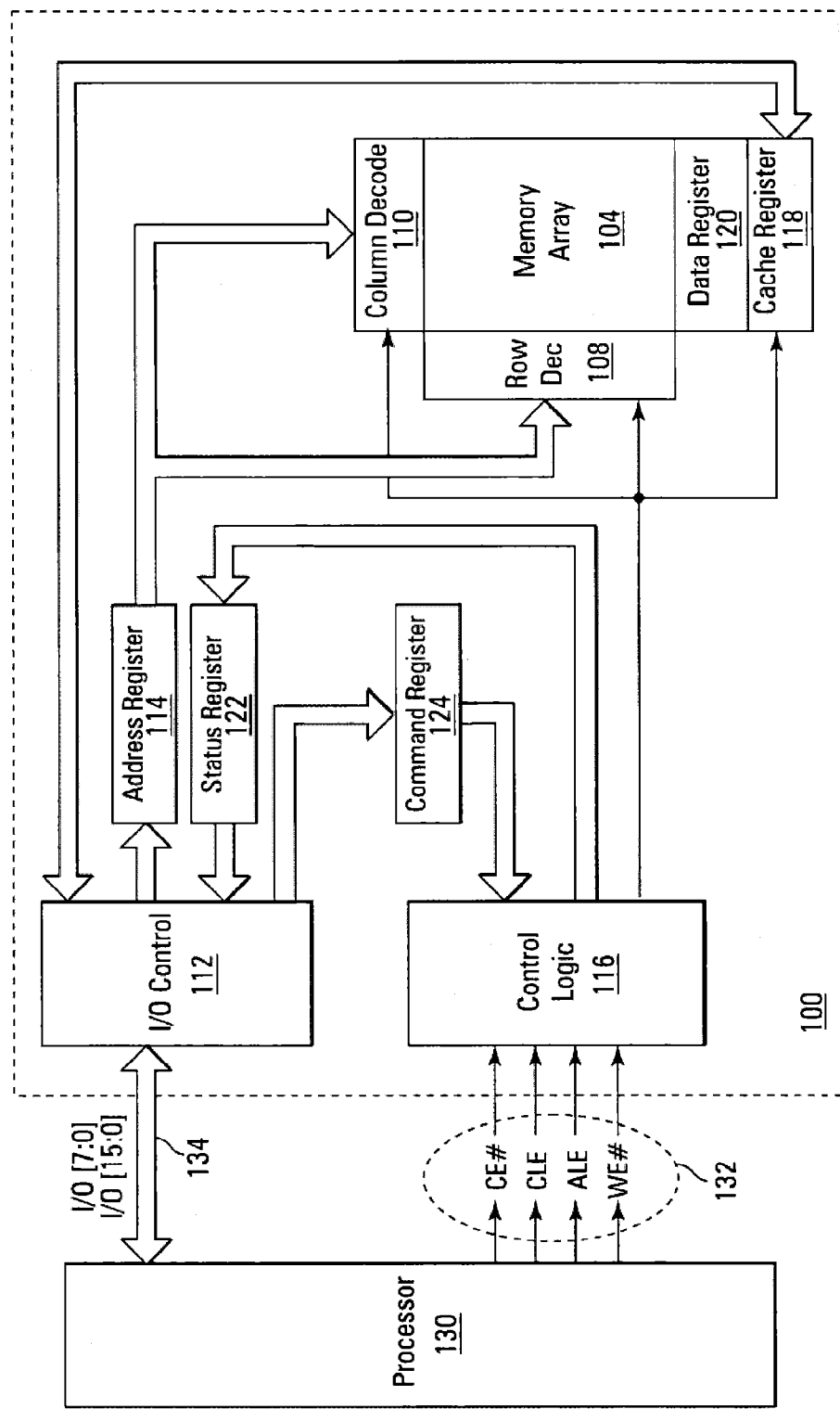
FIG. 1 is a simplified block diagram of a memory device coupled to a processor as part of an electronic system, according to an embodiment of the disclosure.

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the invention, and it is to be understood that other embodiments may be utilized and that process, chemical, electrical or mechanical changes may be made without departing from the scope of the present disclosure. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. In addition, directional references, e.g., upper, lower, top, bottom and sides, are relative to one another and need not refer to an absolute direction. The following detailed description is, therefore, not to be taken in a limiting sense.

One or more embodiments include nanocrystal structures, methods of forming such nanocrystal structures and apparatus making use of such nanocrystal structures. Formation and use of these nanocrystal structures will be described in the context of their use within a memory device as one example of an integrated circuit device. However, use of these nanocrystal structures is not limited to their use as described with reference to memory devices.

The nanocrystal structures are formed through the use of atomic layer deposition (ALD). ALD, also known as atomic layer epitaxy (ALE) is a form of chemical vapor deposition (CVD) widely used in semiconductor fabrication to form layers of material of very thin dimensions, typically on the atomic scale. The ALD process consists of an alternating series of self-limiting chemical reactions, called half-reactions, between gas-phase precursors and a substrate. The precursors are pulsed into the reactor in a sequential fashion, with purging of precursors in between. A series of these pulse/purge/pulse/purge cycles are used to form a continuous layer of material.

In one or more of the disclosed embodiments, however, instead of completing the ALD process, the process is halted prematurely to leave a discontinuous formation of nanocrystals which are then capped by a different material. For example, an ALD process can be used to form a metal nitride material on a substrate and halted before the metal nitride material forms a continuous layer, followed by the formation of a polysilicon material over the discontinuous metal nitride as a bulk portion to encase the discontinuous metal nitride. The two materials may be of the same type, e.g., both conductors, or may be of differing types, e.g., one insulator and one semiconductor.

FIG. 1 is a simplified block diagram of a memory device 100, as one example of an integrated circuit device, in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external processor.

Memory device 100 includes an array of memory cells 104 arranged in rows and columns. The memory device 100 and/or processor 130 include nanocrystal structures formed in accordance with an embodiment of this disclosure. For a further embodiment, the array of memory cells 104 include memory cells having a charge storage node or floating gate in accordance with an embodiment of this disclosure. Although various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays.

A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE/#. Memory device 100 receives commands (in the form of command signals), addresses (in the form of address signals), and data (in the form of data signals) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device. It will be appreciated by those skilled in the art that additional circuitry and signals can be provided, and that the memory device of FIG. 1 has been simplified to help focus on the present disclosure. Additionally, while the memory device of FIG. 1 has been described in accordance with popular conventions for receipt and output of the various signals, it is noted that the various embodiments are not limited by the specific signals and I/O configurations described unless expressly noted herein.

Figure 2:
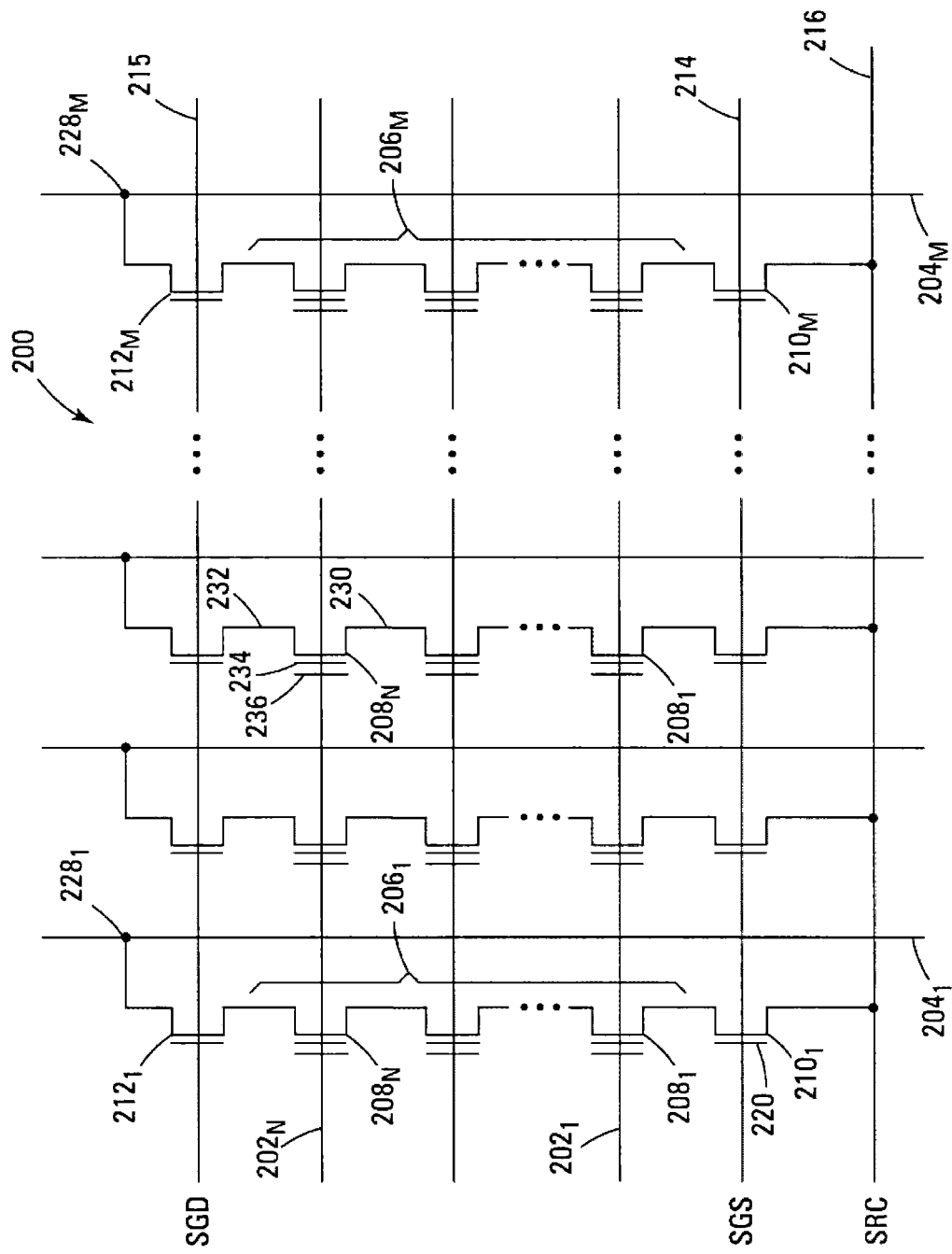
FIG. 2 is a schematic of a NAND memory array as might be found in the memory array of FIG. 1.

FIG. 2 is a schematic of a NAND memory array 200 as might be found in the memory array 104 of FIG. 1 in accordance with another embodiment of the disclosure. As shown in FIG. 2, the memory array 200 includes access lines, i.e., word lines, $202_1$ to $202_N$ and intersecting bit lines $204_1$ to $204_M$. For ease of addressing in the digital environment, the number of word lines 202 and the number of bit lines 204 typically are each some power of two.

Memory array 200 includes NAND strings $206_1$ to $206_M$. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a bit line 204 and a source select line 214, while each drain select gate 212 is located at an intersection of a bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. The floating-gate transistors 208 are formed in accordance with one or more of the various embodiments. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

Figure 3:
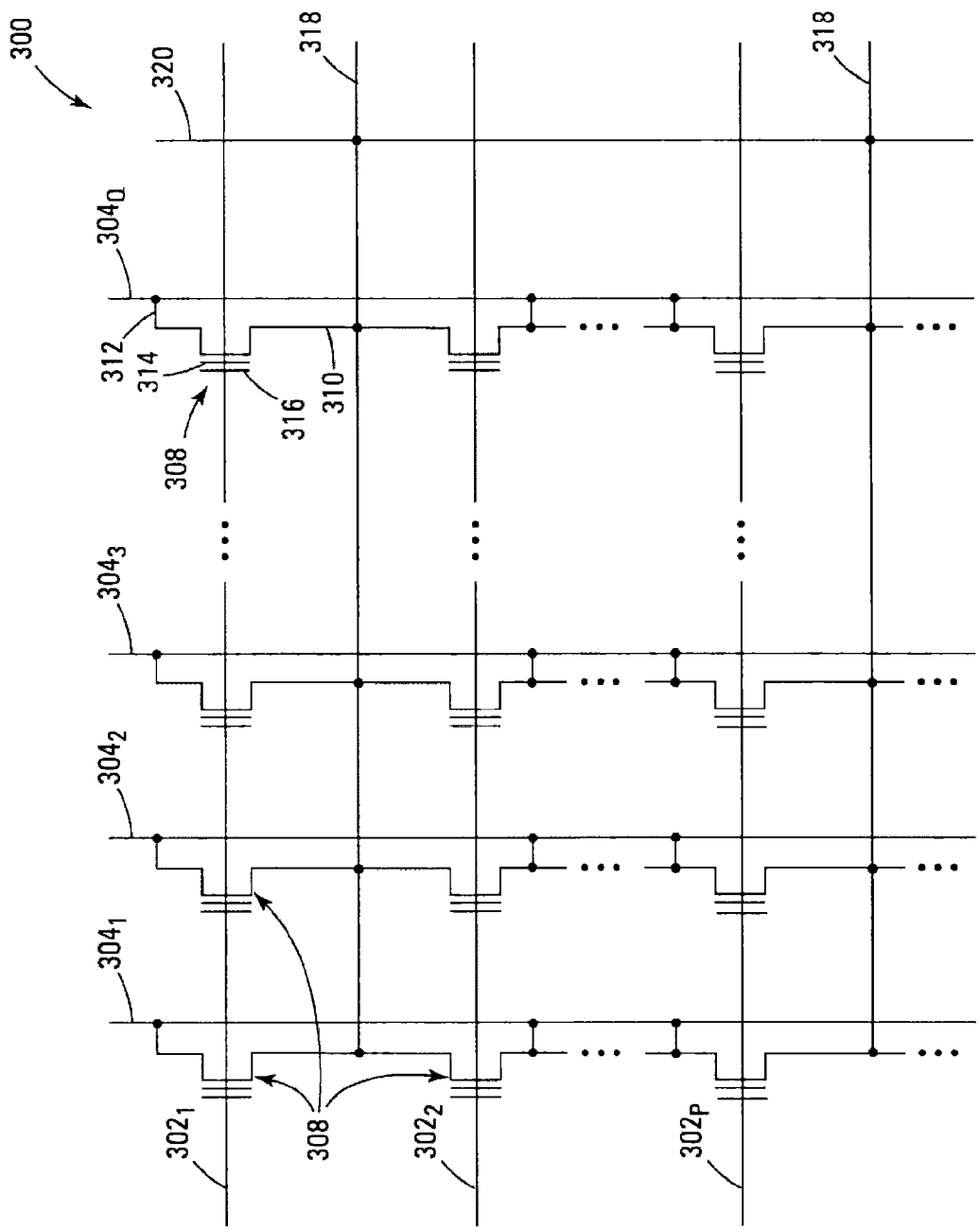
FIG. 3 is a schematic of a NOR memory array as might be found in the memory array of FIG. 1.

FIG. 3 is a schematic of a NOR memory array 300 as might be found in the memory array 104 of FIG. 1 in accordance with another embodiment of the disclosure. Memory array 300 includes access lines, i.e., word lines, $302_1$ to $302_P$ and intersecting local bit lines $304_1$ to $304_Q$. For ease of addressing in the digital environment, the number of word lines 302 and the number of bit lines 304 typically are each some power of two. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Construction of floating-gate transistors 308 includes a source 310 and a drain 312, a floating gate 314, and a control gate 316, as shown in FIG. 3. The floating-gate transistors 308 are formed in accordance with one or more of the various embodiments.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302.

To reduce problems associated with high resistance levels in the array source 318, for example, the array source 318 may be regularly coupled to a metal or other highly conductive line to provide a low-resistance path to ground. The array ground 320 serves as this low-resistance path.

Figure 4:
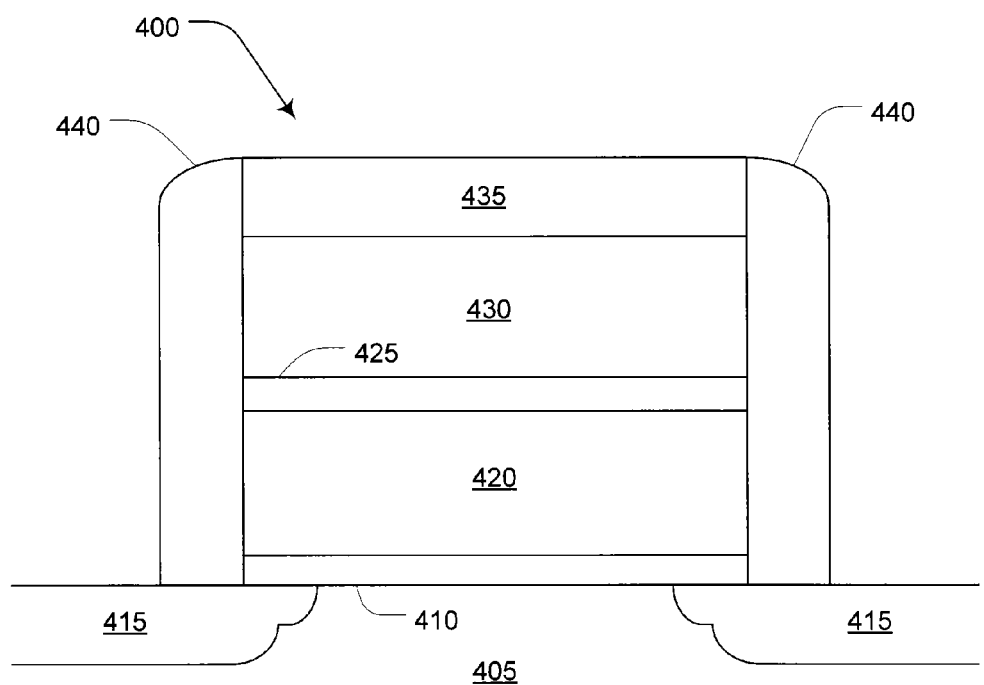
FIG. 4 is a cross-sectional view of a memory cell in accordance with an embodiment of the disclosure.

FIG. 4 is a cross-sectional view of a memory cell 400 in accordance with an embodiment of the disclosure. The memory cell 400 is formed on a semiconductor substrate 405. For one embodiment, the substrate 405 is a monocrystalline silicon substrate. For a further embodiment, substrate 405 is a p-type monocrystalline silicon substrate.

The gate dielectric 410 is formed over an active region of the substrate 405, over which memory cells will be formed. The gate dielectric 410 might be formed by thermal oxidation of the silicon substrate 405. Alternatively, the gate dielectric 410 could be formed by a blanket deposition of a dielectric material, such as by chemical vapor deposition (CVD) or physical vapor deposition (PVD). For one embodiment, gate dielectric 410 contains silicon oxide ($SiO_2$), but may alternatively or additionally include high-K dielectrics such as $HfO_2$, $ZnO_2$, $Al_2O_3$, etc.

Source/drain regions 415 are formed in the substrate 405 generally adjacent the gate dielectric 410. A channel region of the memory cell 400 is defined by the area of the substrate 405 between the source/drain regions 415. Source/drain regions 415 will generally have a conductivity type opposite the conductivity type of the substrate 405. For example, for a p-type substrate 405, the source/drain regions 415 might have an n+-type conductivity.

A charge storage node 420 is formed over the gate dielectric 410. The charge storage node 420 is one or more layers capable of storing a charge indicative of a programmed state of the memory cell 400 and containing nanocrystal structures in accordance with embodiments of the disclosure. In general, the nanocrystal structures are formed of conductive materials which are then encapsulated or isolated by a dielectric material. These isolated nanocrystals serve to store charge and can thus collectively be thought of as a floating gate in a floating-gate memory cell. For some embodiments, the nanocrystals contain a metal component. For example, the nanocrystals may be formed of conductive metal nitrides or metal oxides, such as conductive refractory metal nitrides or conductive refractory metal oxides. In one embodiment, the nanocrystals are titanium nitride. As other examples, nanocrystals can be doped semiconductors (doped Ge or Si), pure metals (example Ru, Re, Pt), metal nitrides (TiN, TaN), metal oxides (RuOx), metal alloys (RuAl, RuTi), or metal-alloy-nitrides (ternary nitrides like RuAlN, TaAlN). These could be formed by using specific precursors to control the nanocrystal density during ALD. For example TiN when deposited using a $TiCl_4$ precursor forms a continuous film easily, while when deposited by a metal organic precursor like Ti precursor [Ti($OCH_2CH_2NMe_2$)$_4$, Ti(dmae)4] (dmae=dimethylaminoethoxide) forms nanocrystals in the initial stages of growth. However, other molecular structures could be used in the floating gate 420 provided the resulting nanocrystals serve as charge-storage sites within the bulk material. Formation of the charge storage node 420 will be described in more detail with reference to subsequent FIGS. 5A-5B, 6A-6D and 7A-7B.

The intergate dielectric 425 may be formed over the charge storage node 420. The intergate dielectric 425 contains a dielectric material. For one embodiment, intergate dielectric 425 contains silicon oxide ($SiO_2$), but may alternatively or additionally include high-K dielectrics such as hafnium oxide ($HfO_2$), zirconium oxide ($ZrO_2$), zinc oxide ($ZnO_2$), aluminum oxide ($Al_2O_3$), aluminum hafnium oxide (AlHfOx), etc. However, the intergate dielectric 425 may be omitted if the nanocrystals of the charge storage node 420 are sufficiently isolated by dielectric material, such as of the type described for intergate dielectric 425.

A control gate 430 is formed over the intergate dielectric 425, or a dielectric portion of charge storage node 420 if the intergate dielectric 425 is omitted. The control gate 430 is generally one or more layers of conductive material. For one embodiment, the control gate 430 contains a conductively-doped polysilicon. For a further embodiment, the control gate 430 includes a metal-containing layer over a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate 430 contains multiple metal-containing layers, e.g., a titanium nitride (TiN) barrier layer over the intergate dielectric 425, a titanium (Ti) adhesion layer over the barrier layer and a tungsten (W) layer over the adhesion layer.

A cap 435 is generally formed over the control gate 430 to act as an insulator and barrier layer to protect the control gate 430 during subsequent processing. The cap 435 contains a dielectric material and may include such dielectrics as silicon oxides (SiOx), silicon nitride (SiNx), and silicon oxynitrides (SiOxNy). For one embodiment, the cap 435 is a silicon nitride, formed by such methods as CVD.

The gate stack, i.e., gate dielectric 410, charge storage node 420, intergate dielectric 425 (if used) and control gate 430, along with cap 435, may be patterned to define access lines, i.e., word lines, of a memory device. It is noted that additional layers may form the gate stack, such as barrier layers to inhibit diffusion between opposing layers or adhesion layers to promote adhesion between opposing layers. Sidewall spacers 440 may be formed on the sidewalls of the gate stacks to protect and insulate the sidewalls. Sidewall spacers 440 are typically the same dielectric material as used for the cap 435, but may include other dielectric materials. Formation may include a blanket deposit of a layer of dielectric material on the patterned gate stacks followed by an anisotropic etch to preferentially remove horizontal portions of the layer of dielectric material, leaving vertical portions adjacent the sidewalls of the gate stacks.

Figure 5A:
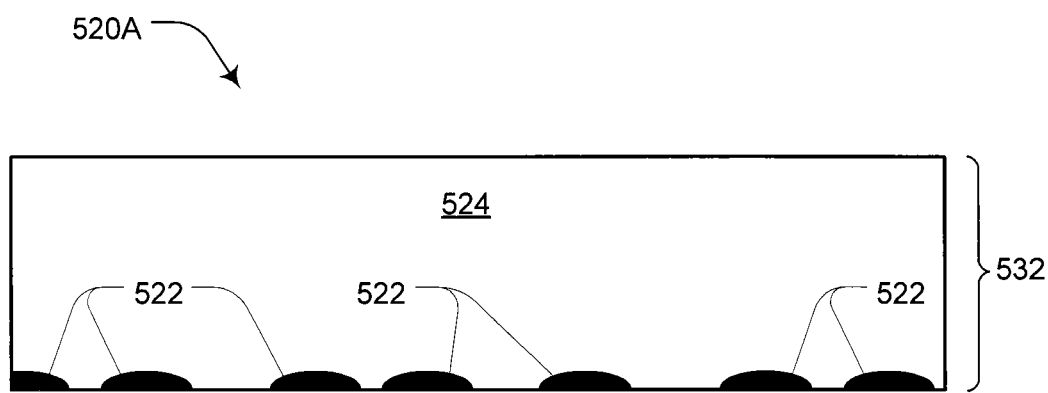
FIGS. 5A-5B are cross-sectional views of embodiments of charge storage nodes of the memory cell of FIG. 4.

FIG. 5A is a cross-sectional view of a charge storage node 520A showing further detail of one embodiment of the charge storage node 420 of FIG. 4. FIG. 5A shows conceptually the discontinuous portions 522, which are sometimes referred to as "nanocrystal islands," and the continuous portion 524 of the charge storage node 520A. The discontinuous portions 522 are formed by using ALD and halting the process before it forms a continuous layer, i.e., while the portions 522 are in a discontinuous form. The continuous portion 524 may be formed by ALD or other process, such as other CVD processes or PVD processes. The continuous portion 524 is a dielectric material used to isolate the discontinuous portions 522. As such, the continuous portion 524 should be formed to a thickness sufficient to at least cover the discontinuous portions 522, e.g., the thickness of the bulk portion should be greater than a height of the nanocrystal islands at least in those areas of the continuous portion 524 overlying those nanocrystal islands. The discontinuous portions 522 are composed of a conductive material. It is noted that the continuous portion 524 of layer 532 could serve the function of the intergate dielectric 425 of FIG. 4. Although described specifically as a charge storage node of a memory cell in this example, the layer 532 of FIG. 5A could represent any layer of an integrated circuit device. Thus, for embodiments other than charge storage nodes, the materials of the discontinuous portions 522 and the continuous portion 524 need not be conductive and dielectric as noted above, but would merely be composed of different materials.

Figure 5B:
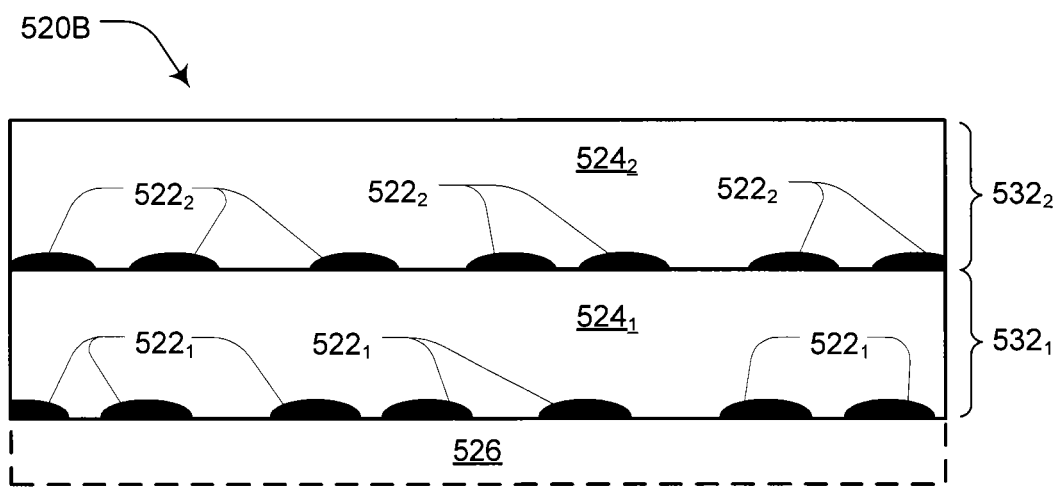

FIG. 5B is a cross-sectional view of a charge storage node 520B showing further detail of another embodiment of the charge storage node 420 of FIG. 4. FIG. 5B shows conceptually the discontinuous portions $522_1$ and $522_2$ and continuous portions $524_1$ and $524_2$ of the charge storage node 520B. The discontinuous portions $522_1$ and $522_2$ are formed by using ALD and halting the process before each forms a continuous layer. The continuous portions $524_1$ and $524_2$ may be formed by ALD or other process, such as other CVD processes or PVD processes. Note that while the example embodiment of FIG. 5B depicts the charge storage node 520B to contain two layers $532_1$ and $532_2$, additional layers may be utilized. The continuous portions $524_1$ and $524_2$ should each be formed to a thickness sufficient to at least cover the discontinuous portions $522_1$ and $522_2$, respectively, e.g., the thickness of the bulk portions, at least in those areas of the bulk portions overlying their respective nanocrystal islands, should be greater than a height of the nanocrystal islands for each bulk portion.

The discontinuous portions $522_1$ and $522_2$ are each composed of a conductive material. However, the discontinuous portions $522_1$ may be composed of the same or a different conductive material than the discontinuous portions $522_2$, and the continuous portion $524_1$ may be composed of the same or a different dielectric material than the continuous portion $524_2$. Thus, for each layer of the charge storage node 520B, the material for the discontinuous portions may be chosen independently of the materials of the discontinuous portions of other layers, and the material for the continuous portion may be chosen independently of the materials of the continuous portions of other layers. However, consideration should be given to compatibility of materials that will be in contact with each other, e.g., compatibility between discontinuous portions $522_2$ and both the continuous portion $524_1$ and the continuous portion $524_2$. It is noted that the continuous portion of the uppermost layer, e.g., continuous portion $524_2$ of layer $532_2$ in this example, could serve the function of the intergate dielectric 425 of FIG. 4. Although described specifically as a charge storage node of a memory cell in this example, the layers of FIG. 5B could represent any layers of an integrated circuit device. Thus, for embodiments other than charge storage nodes, the materials of the discontinuous portions 522 and the continuous portions 524 need not be conductive and dielectric as noted above, but would merely be different materials within each layer 532, although the materials of each layer 532 could be chosen independently.

Note that FIG. 5B also depicts an optional portion 526 under the discontinuous portion $522_1$. Thus, the discontinuous portion $522_1$ need not be formed directly on the gate dielectric. For example, the portion 526, as an underlying layer to the discontinuous portion $522_1$, could be the same material as the continuous portion $524_1$, thus "floating" the discontinuous portion $522_1$ within this second material. The charge storage node 520A could be modified in the same way to incorporate an optional portion 526 underlying its discontinuous portion 522.

FIGS. 6A-6D depict conceptually an ALD process in accordance with an embodiment of the disclosure. Note that no attempt has been made to represent specific molecular structures. However, the concepts of ALD as they relate to the present disclosure will be aided by FIGS. 6A-6D.

In ALD, gaseous precursors are introduced one at a time to the substrate surface mounted within a reactor (e.g., a reaction chamber). This introduction of the gaseous precursors takes the form of sequential pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated. The first precursor material be introduced may be called the precursor, and the next material introduced may be called the reactant, but both materials are precursors to the eventual material formed by the ALD reaction, and thus both will be referred to herein as precursors.

Figure 6A:
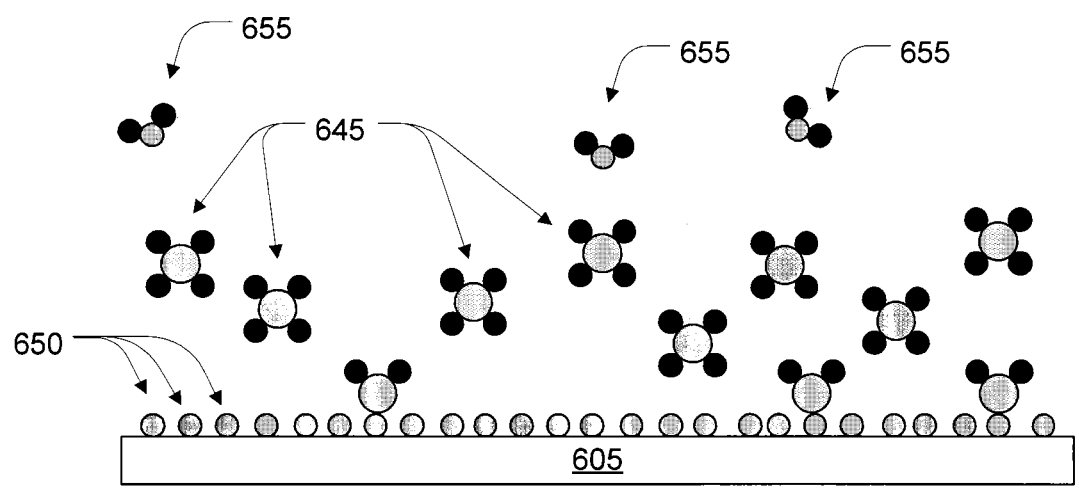
FIGS. 6A-6D depict conceptually an atomic layer deposition process in accordance with an embodiment of the disclosure.

In FIG. 6A, a first precursor 645 is introduced into the reactor and a portion is chemisorbed at a surface of the substrate 605 during the first pulsing phase. Typically, the first precursor 645 is chemisorbed at an adsorption site 650 of the surface, such as absorbed hydroxyl sites resulting from exposure of the substrate to water vapor. However, the surface treatment for creation of adsorption sites 650 will be dependent upon the chosen precursors. The reactor is then purged or evacuated to remove excess first precursor 645 in FIG. 6B, i.e., the first precursor 645 that has not been chemisorbed onto the adsorption sites 650 of the substrate 605, and reaction products 655. The chemisorbed first precursor 645 results in reaction sites 660 for the subsequent phase of the ALD process.

Figure 6B:
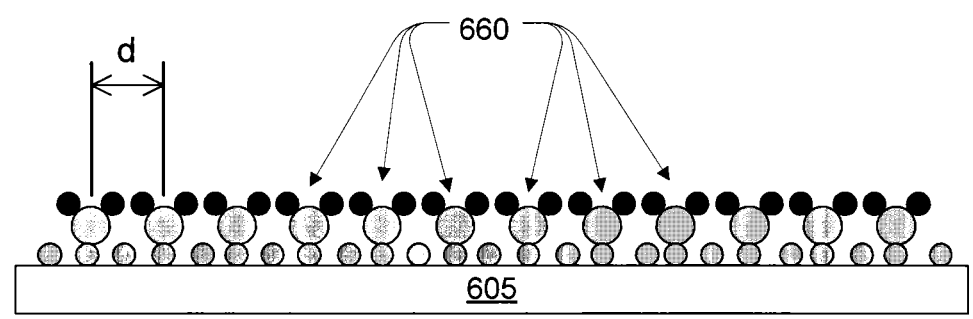

In FIG. 6B, the spacing d represents the minimum distance between adjacent molecules of the first precursor controlled by the steric hindrance of those molecules. Thus, larger molecules may not be able to make use of each potential adsorption site 650. In the usual application of the ALD processes, the spacing d is desired to be close to the inter-atomic spacing of the deposited film, thereby enabling surface saturation which leads to an ideal 2-dimensional layer-by-layer growth. Therefore in the usual instances of the ALD application, large precursors are undesirable due to the resulting non-planarity and slow rate of growth. In one embodiment, the choice of larger-sized precursors, in conjunction with proper substrate treatment to provide adsorption sites 650 suitable for the chosen precursor, would exploit this "non-ideality" of the larger precursor sizes to help facilitate a desirable 3-dimensional growth of nanometer-sized "islands." However, regardless of the molecular size of the precursors, imperfections of the surface of the substrate 605 may also produce discontinuities in the resulting layer. Typical ALD processing overcomes these imperfections by performing multiple cycles until a continuous layer is formed.

Figure 6C:
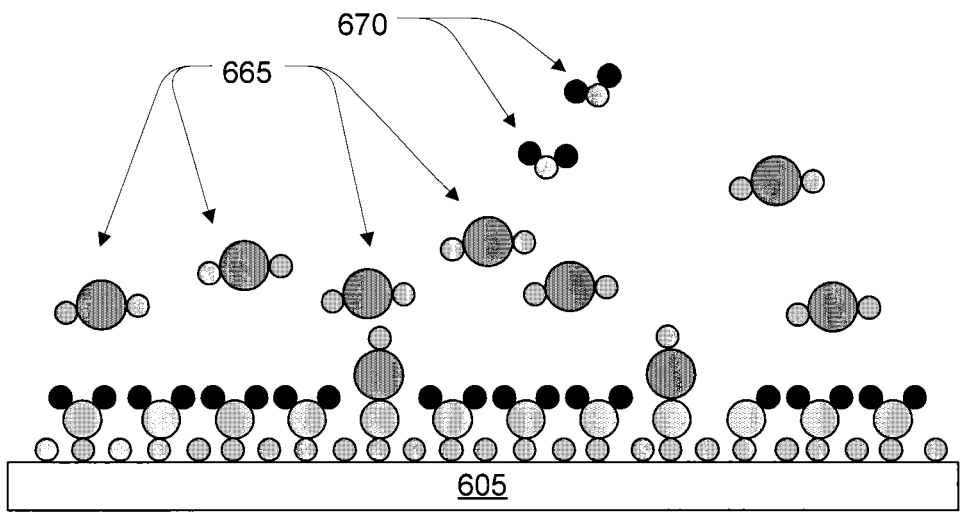
Figure 6D:
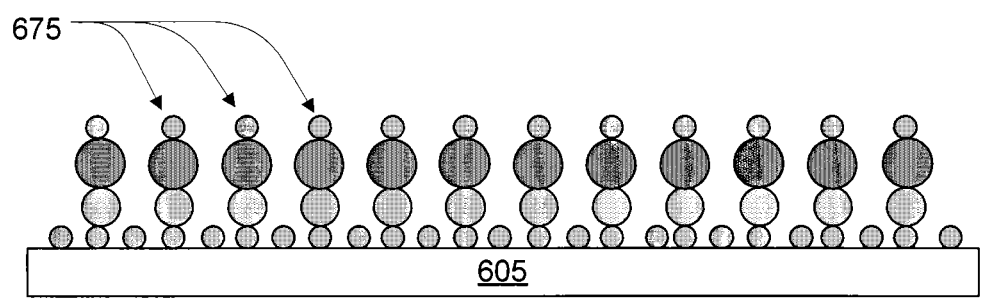

In FIG. 6C, a second precursor 665 is introduced into the reactor and a portion reacts with the first precursor 645 at reaction sites 660 during the second pulsing phase. The reactor is then purged or evacuated to remove excess second precursor 665 in FIG. 6D, i.e., the second precursor 665 that has not reacted with first precursor 645 at reaction sites 660, and reaction products 670. Following the reaction of the second precursor 665 with the first precursor 645 at reaction sites 660, adsorption sites 675 are formed for chemisorbing additional first precursor 645 in a subsequent cycle of the ALD process. A number of cycles of the phases of FIGS. 6A-6D can be performed. However, in accordance with embodiments of the disclosure, the number of cycles is limited to a number that does not result in a continuous film.

For one embodiment, different precursors could be used during different cycles of an ALD process. For example, TiN could be deposited during one or more initial ALD cycles using a large titanium precursor for the first pulsing phase, such as $[Ti(OCH_2CH_2NMe_2)_4$, $Ti(dmae)4]$, to define the nucleation density for TiN islands. Subsequent ALD cycles could then use a smaller titanium precursor for their first pulsing phase, such as $TiCl_4$, to preferentially grow TiN only on the nucleated islands having a pre-defined density. In this example, the nitrogen precursor for the second pulsing phase, such as ammonia, could be the same for both titanium precursors, although different precursors could also be used for different second pulsing phases. Alternatively, smaller precursors could be used during initial ALD cycles to define a higher nucleation density, and subsequent ALD cycles could use a larger precursor to limit further increases in density of the resulting islands.

Figure 7A:
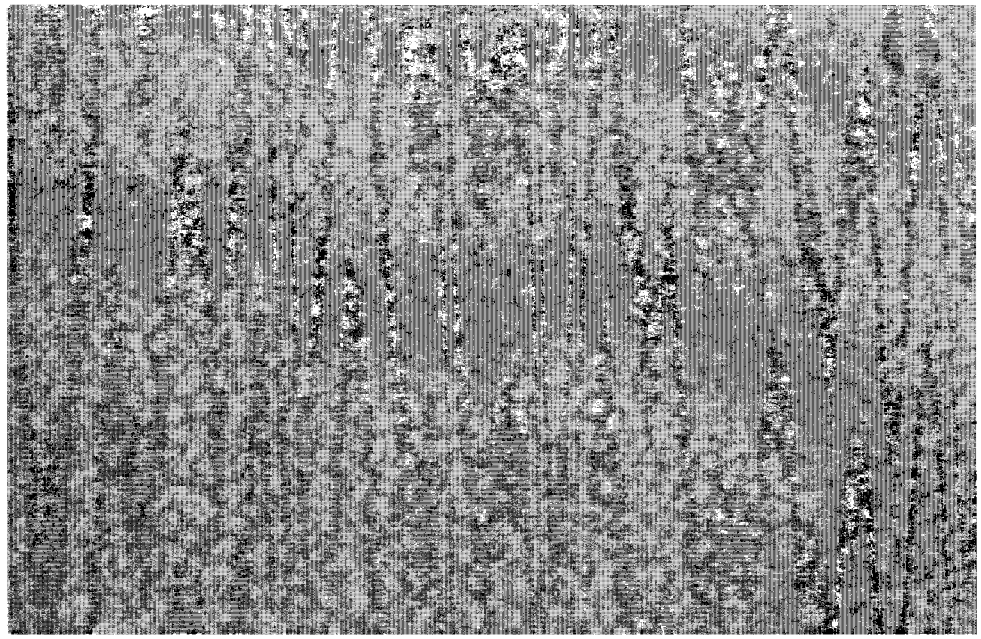
FIGS. 7A-7B are plan view scanning electron micrograph images demonstrating the formation of nanocrystal islands in accordance with an embodiment of the disclosure.
Figure 7B:
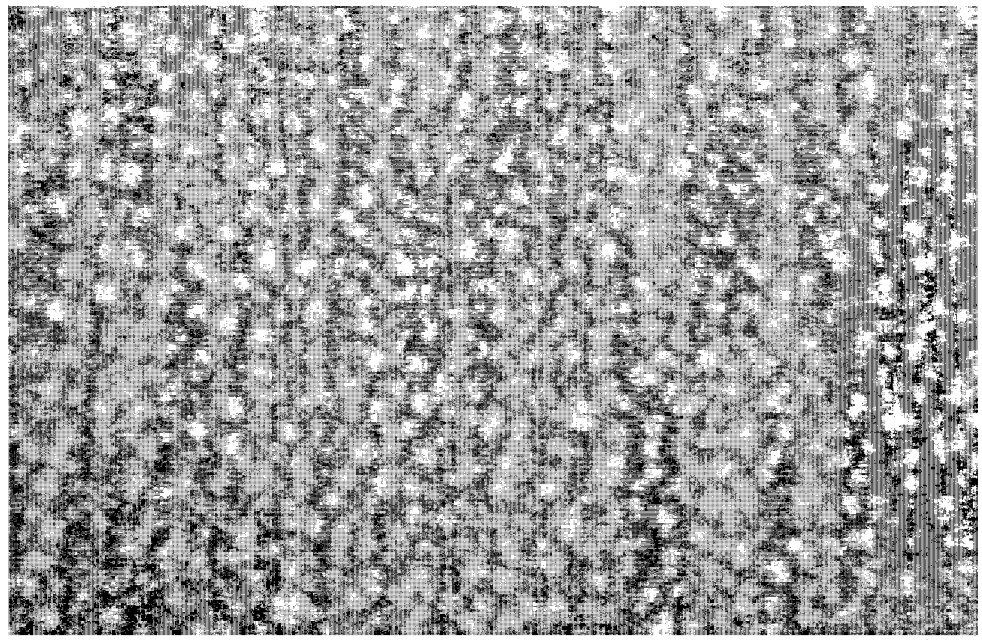

FIGS. 7A-7B are plan view scanning electron micrograph (SEM) images demonstrating the formation of nanocrystal islands in accordance with one or more embodiments of the disclosure. FIG. 7A is a plan view SEM image of a dielectric surface before titanium nitride (TiN) deposition. FIG. 7B is a plan view SEM image of the dielectric surface after 10 cycles of ALD using a titanium tetrachloride ($TiCl_4$) precursor and an ammonia ($NH_3$) reactant gas. In this instance the deposition was terminated before the formation of the continuous film and hence achieved a high density of nanocrystals. Note that a continuous film under similar conditions would form after about 25 ALD cycles. In general, it would be a relatively uncomplicated task to determine, for a given set of precursors and reaction conditions, how many ALD cycles would be nominally required to form a continuous layer or, conversely, how many ALD cycles would be allowable to avoid developing a continuous layer. For one embodiment, an ALD process is halted at less than half of the cycles nominally required to form a continuous layer. Following formation of the nanocrystal islands as shown in FIG. 7B, a second material would be formed as a continuous layer over the nanocrystal islands to form a layer such as depicted in FIG. 5A or 5B.

Using the techniques described herein, the density of nanocrystals formed can reach approximately 1 E13/cm$^2$. Such densities are significantly higher than known techniques involving ion implantation or thin-layer deposition, followed by annealing to cause recrystallization. In addition, thermal damage is reduced and/or thermal budget is improved by not requiring an annealing process in the formation of the nanocrystals.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of forming a layer, comprising:
   depositing a first material using an atomic layer deposition process, wherein the atomic layer deposition process comprises using a particular set of precursors during one or more cycles of the atomic layer deposition process to define a nucleation density of the first material, and using a different set of precursors during subsequent cycles of the atomic layer deposition process;
   halting the atomic layer deposition process of the first material before the deposited first material forms a continuous layer; and
   forming a second material over the first material;
   wherein the second material is different than the first material.

2. The method of claim 1, wherein depositing a first material using an atomic layer deposition process comprises depositing the first material on an underlying material that is the same as the second material.

3. A method of forming a layer, comprising:
depositing a first material using an atomic layer deposition process;
halting the atomic layer deposition process of the first material before the deposited first material forms a continuous layer; and
forming a second material over the first material;
wherein the second material is different than the first material; and
wherein halting the atomic layer deposition process of the first material before the deposited first material forms a continuous layer comprises:
determining a first number of cycles of the atomic layer deposition process necessary to form a continuous layer of the first material; and
halting the atomic layer deposition process at a second number of cycles of the atomic layer deposition process that is less than the first number.

4. The method of claim 3, wherein halting the atomic layer deposition process at a second number of cycles of the atomic layer deposition process that is less than the first number comprises halting the atomic layer deposition process at a number of cycles of the atomic layer deposition process that is less than half of the first number.

5. A method of forming a layer, comprising:
depositing a first material using an atomic layer deposition process;
halting the atomic layer deposition process of the first material before the deposited first material forms a continuous layer; and
forming a second material over the first material;
depositing a third material over the second material using an atomic layer deposition process;
halting the atomic layer deposition process of the third material before the deposited third material forms a continuous layer; and
forming a fourth material over the third material;
wherein the second material is different than the first material;
wherein the third material is different than the first material; and
wherein the fourth material is different than the third material.

6. A method of forming a layer, comprising:
depositing a first material using an atomic layer deposition process, and choosing a first precursor of the atomic layer deposition process for the first material to have a molecular size sufficient to produce a density of nanocrystals of the first material of approximately $1E13/cm^2$;
halting the atomic layer deposition process of the first material before the deposited first material forms a continuous layer; and
forming a second material over the first material;
wherein the second material is different than the first material.

7. A method of forming a layer, comprising:
depositing a first material using an atomic layer deposition process;
halting the atomic layer deposition process of the first material before the deposited first material forms a continuous layer; and
forming a second material over the first material;
wherein the second material is different than the first material; and
wherein depositing a first material using an atomic layer deposition process comprises:
for one or more initial atomic layer deposition cycles, chemisorbing a first precursor having a molecular size, and reacting the chemisorbed first precursor with a second precursor; and
for one or more subsequent atomic layer deposition cycles, chemisorbing a third precursor having a molecular size, and reacting the chemisorbed third precursor with a fourth precursor;
wherein the molecular size of the first precursor is different than the molecular size of the third precursor.

8. The method of claim 7, wherein the molecular size of the first precursor is greater than the molecular size of the third precursor.

9. The method of claim 8, wherein the second precursor and the fourth precursor are the same precursors.

10. A method of forming a layer, comprising:
depositing a first material using an atomic layer deposition process;
halting the atomic layer deposition process of the first material before the deposited first material forms a continuous layer; and
forming a second material over the first material;
wherein the second material is different than the first material; and
wherein depositing a first material using an atomic layer deposition process comprises:
for one or more initial atomic layer deposition cycles:
pulsing a first precursor into a reactor, wherein the first precursor has a first molecular size;
chemisorbing a portion of the first precursor on adsorption sites;
purging or evacuating excess first precursor and reaction products from the reactor;
pulsing a second precursor into the reactor;
reacting a portion of the second precursor with reaction sites of the chemisorbed first precursor; and
purging or evacuating excess second precursor and reaction products from the reactor; and
for one or more subsequent atomic layer deposition cycles:
pulsing a third precursor into a reactor, wherein the third precursor has a second molecular size different from the first molecular size;
chemisorbing a portion of the third precursor on adsorption sites;
purging or evacuating excess third precursor and reaction products from the reactor;
pulsing a fourth precursor into the reactor;
reacting a portion of the fourth precursor with reaction sites of the chemisorbed third precursor; and
purging or evacuating excess fourth precursor and reaction products from the reactor.

11. A method of forming a gate stack of a memory cell, the method comprising:
forming a first dielectric;
forming a charge storage node over the first dielectric, wherein forming the charge storage node comprises:
performing an atomic layer deposition process of a conductive material on an underlying dielectric material;
halting the atomic layer deposition process of the conductive material while the conductive material is in a discontinuous form; and forming a dielectric material over the conductive material; and forming a control gate over the charge storage node.

12. The method of claim 11, wherein performing an atomic layer deposition process of a conductive material on an underlying material comprises performing the atomic layer deposition process of the conductive material on the first dielectric.

13. The method of claim 11, wherein halting the atomic layer deposition process of the conductive material while the conductive material is in a discontinuous form comprises halting the atomic layer deposition process of the conductive material at a number of cycles that is less than a number of cycles necessary to form a continuous film of the conductive material.

14. The method of claim 11, wherein halting the atomic layer deposition process of the conductive material while the conductive material is in a discontinuous form comprises halting the atomic layer deposition process of the conductive material at a number of cycles that is less than half a number of cycles necessary to form a continuous film of the conductive material.

15. The method of claim 11, wherein forming the dielectric material over the conductive material further comprises encasing the conductive material between the dielectric material and the underlying material.

16. The method of claim 11, wherein forming the charge storage node further comprises:
    performing an atomic layer deposition process of a second conductive material on the dielectric material;
    halting the atomic layer deposition process of the second conductive material while the second conductive material is in a discontinuous form; and
    forming a second dielectric material over the second conductive material.

17. The method of claim 16, wherein forming the second dielectric material comprises forming the same dielectric material as was formed over the conductive material.

18. The method of claim 16, wherein forming the second dielectric material over the second conductive material further comprises encasing the second conductive material between the second dielectric material and the conductive material.

19. The method of claim 11, wherein performing an atomic layer deposition process of a first material on an underlying material comprises one or more cycles of:
    pulsing a first precursor into a reactor;
    chemisorbing a portion of the first precursor on adsorption sites;
    purging or evacuating excess first precursor and reaction products from the reactor;
    pulsing a second precursor into the reactor;
    reacting a portion of the second precursor with reaction sites of the chemisorbed first precursor; and
    purging or evacuating excess second precursor and reaction products from the reactor.

20. The method of claim 19, wherein pulsing a first precursor into the reactor comprises pulsing titanium tetrachloride into the reactor and wherein pulsing a second precursor into the reactor comprises pulsing ammonia into the reactor.

21. The method of claim 19, wherein performing an atomic layer deposition process of a first material on an underlying material further comprises one or more subsequent cycles of:
    pulsing a third precursor into the reactor;
    chemisorbing a portion of the third precursor on adsorption sites;
    purging or evacuating excess third precursor and reaction products from the reactor;
    pulsing a fourth precursor into the reactor;
    reacting a portion of the fourth precursor with reaction sites of the chemisorbed third precursor; and
    purging or evacuating excess fourth precursor and reaction products from the reactor;
    wherein a molecular size of the third precursor differs from a molecular size of the first precursor.

\* \* \* \* \*

UNITED STATES PATENT AND TRADEMARK OFFICE
CERTIFICATE OF CORRECTION

| | | |
|---|---|---|
| PATENT NO. | : 8,900,946 B2 | Page 1 of 1 |
| APPLICATION NO. | : 14/171010 | |
| DATED | : December 2, 2014 | |
| INVENTOR(S) | : Majhi et al. | |

It is certified that error appears in the above-identified patent and that said Letters Patent is hereby corrected as shown below:

On the Title Page, in Item [54] and in the Specification, column 1, line 1, in Title, delete "METHOD" and insert -- METHODS --, therefor.

Signed and Sealed this
Third Day of March, 2015

Michelle K. Lee
*Deputy Director of the United States Patent and Trademark Office*